United States Patent [19]

Nakamura et al.

[11] Patent Number: 4,612,471
[45] Date of Patent: Sep. 16, 1986

[54] PIEZOELECTRIC VIBRATOR

[75] Inventors: Takeshi Nakamura, Kyoto; Kenji Ando, Kanagawa; Ikuo Matsumoto, Kyoto, all of Japan

[73] Assignee: Murata Manufacturing Co., Ltd., Japan

[21] Appl. No.: 728,788

[22] Filed: Apr. 30, 1985

[30] Foreign Application Priority Data

May 1, 1984 [JP] Japan .................................. 59-88860

[51] Int. Cl.⁴ ............................................ H01L 41/08
[52] U.S. Cl. .................................... 310/321; 310/312; 310/348; 310/368; 310/351
[58] Field of Search ............... 310/312, 321, 351, 368, 310/348

[56] References Cited

U.S. PATENT DOCUMENTS 4,469,975 9/1984 Nakamura et al. ................. 310/321

Primary Examiner—Patrick R. Salce
Assistant Examiner—Emanuel Todd Voeltz
Attorney, Agent, or Firm—Ostrolenk, Faber, Gerb & Soffen

[57] ABSTRACT

A piezoelectric vibrator adapted to operate in a spreading vibrating mode comprises compensation parts for compensating for the non-vibratory, or dead, region of a piezoelectric element which is formed between two confronting coupling pieces. The compensation parts comprise peripheral parts of the piezoelectric element that extend in an non-uniform manner from a center line passing through the respective centers of the confronting coupling pieces.

5 Claims, 6 Drawing Figures

PIEZOELECTRIC VIBRATOR

BACKGROUND OF THE INVENTION

The present invention relates to a piezoelectric vibrator, and, more particularly, to one that operates in a spreading vibration mode.

A conventional piezoelectric vibrator that operates in the spreading vibration mode utilizes the spreading vibration of long or short sides of a piezoelectric element which is in the form of a rectangular plate. One example of a conventional piezoelectric vibrator is as shown in FIG. 1. In FIG. 1, reference numeral 2 designates a spreading vibration mode piezoelectric element. The piezoelectric element 2 has a vibrating plate 5 of permanently elastic metal, a piezoelectric film 8, and a vibrating electrode film 9. The centers of the short sides of the rectangular vibrating plate 5 are supported through a pair of coupling pieces 6 and 6' by a holding frame 7. The piezoelectric element 2 is accommodated in a case (not shown) by supporting the holding frame 7 therein. The piezoelectric vibrator utilizes the spreading vibration of the short sides of the vibrating plate 5. That is, the vibration of the piezoelectric vibrator is in the direction of the short sides with a node of the vibration of a line connecting the coupling pieces 6 and 6'. The frequency of the vibration relates to the length of the short sides.

In the piezoelectric vibrator as shown in FIG. 1, the dead region A (shaded with oblique lines) of the vibrating plate is formed in the vibrating plate body 5a between the coupling pieces 6 and 6'. However, in the case of a low frequency band, the effects of the dead region A on the resonance frequency characteristic of the piezoelectric element 2 can be disregarded because the vibrating plate 5 is much larger in size than the coupling pieces 6 and 6'. On the other hand, when it is required to apply the spreading vibration mode piezoelectric vibrator described above to a device having a high resonance frequency of, for example, 3.58 MHz, it is necessary to extremely miniaturize the vibrating plate 5, and accordingly the size of the coupling pieces 6 and 6' relative to the size of the plate 5 cannot be disregarded. Therefore, if the size of the piezoelectric vibrator is reduced to accommodate a high resonance frequency, then the following difficulties are caused: the resonance resistance is increased, the quality factor (Q) is decreased, and the resonance frequency characteristic and other characteristics are greatly varied, for instance. Therefore, in the prior art, in the case of such a piezoelectric vibrator for high frequency, other vibration modes such as a thickness expansion vibration mode and a thickness shear vibration mode are utilized, and it is not practical to utilize spreading vibration mode piezoelectric vibrators.

SUMMARY OF THE INVENTION

In view of the foregoing, an object of this invention is to provide a piezoelectric vibrator adapted to operate in a spreading vibration mode and which can be used for high resonance frequency. In realizing the foregoing and further objects of the invention, compensation means are included in a piezoelectric vibrator for compensating for the dead region of the piezoelectric element formed between two confronting coupling pieces, the compensation means comprising peripheral parts of the piezoelectric element that extend in a non-uniform manner from a center line that passes through the respective centers of the confronting coupling pieces.

DESCRIPTION OF THE PREFERRED EMBODIMENTS

The present invention will be described in detail with reference to the embodiment shown in the accompanying drawings.

Figure 1:
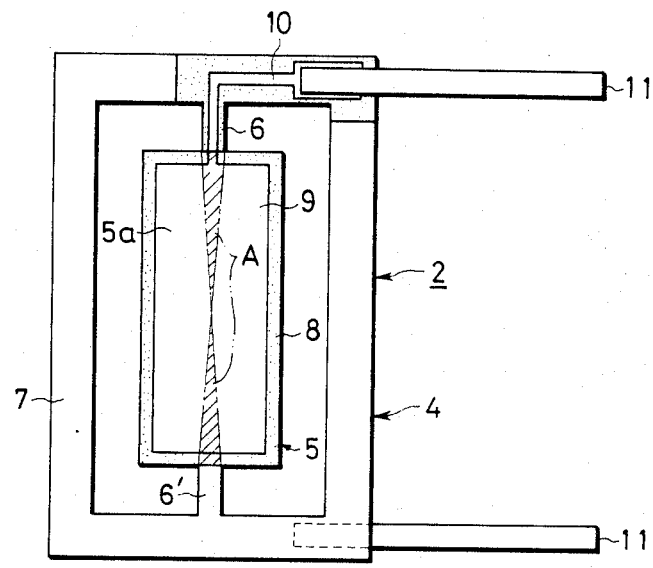
FIG. 1 is a plan view of a conventional piezoelectric vibrator operating in a spreading vibration mode.
Figure 2:
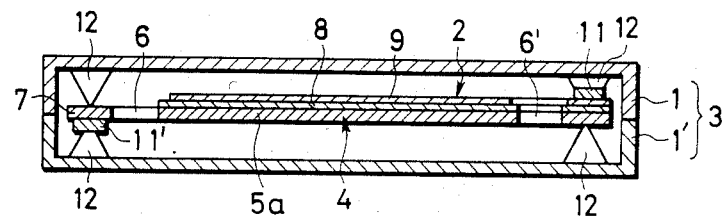
FIG. 2 is a vertical sectional view of one embodiment of the present invention.
Figure 3:
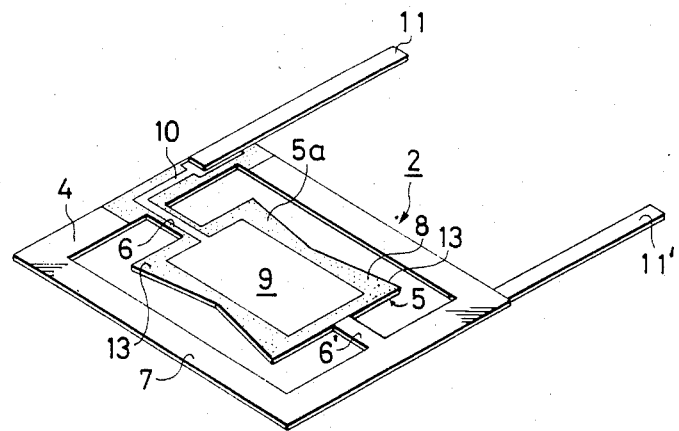
FIg. 3 is a perspective view of an integral frame shown in FIG. 2.

FIG. 2 is a sectional view of a piezoelectric resonator utilizing a short side spreading vibration mode, in accordance with the invention; and FIG. 3 is a perspective view of essential components of the piezoelectric resonator. The piezoelectric resonator is a small one having a high resonance frequency. In FIG. 2, reference numerals 1 and 1' designate the upper and lower halves respectively, of a case 3 of synthetic resin. Each of the upper and lower halves is in the form of a shallow box which is open on one side. The case 3 is formed by combining the upper and lower halves 1 and 1' in such a manner that the open surfaces are put together.

As shown in FIG. 3, a piezoelectric element 2 has an integral frame 4 which is formed by subjecting a permanently elastic metal plate of material, such as those sold under the tradenames "Elimvar", "Imvar" and "Coelimvar", to pressing or etching. The frame 4 is such that a vibrating plate 5 whose main part 5a is substantially rectangular as viewed from above is supported by a rectangular holding frame 7 through a pair of coupling pieces 6 and 6' which extend from the centers of the short sides of the vibrating plate 5. A piezoelectric film 8 of zinc oxide (ZnO) is fixedly formed over a predetermined area of one main surface of the frame 4; i.e., the entire surface of the vibrating plate 5 and the region which is extended from the vibrating plate through the coupling piece 6 to a predetermined corner of the holding frame 7, by sputtering or the like. Furthermore, a vibrating electrode film 9 overlying the vibrating plate 5, and a leader 10 are vacuum-deposited on the piezoelectric film 8. The leader 10 extends from the electrode film 9 through the one coupling piece 6 to a predetermined corner of the holding frame 7. The vibrating electrode film 9 is of aluminum or the like. In FIG. 3, reference numerals 11 and 11' respectively designate two lead wires extending from the integral frame 4. Lead wire 11 is connected to the end of the leader 10, while the lead wire 11 is connected to the holding frame 7. Both sides of the piezoelectric element 2 thus constructed are covered by the above-described upper and lower halves 1 and 1' of case 3, and then the upper and lower halves are sealingly joined together by welding or by using adhesive. With the integral frame 4 situated in the case 3 as described above, then the four corners of the holding frame 7 are clamped by protrusions 12 which are extended from the inner surfaces of the halves 1' in such a manner that the protrusions 12 are in point-contact with the holding frame. Thus, the integral frame 4 is held in place in the case 3. Reference numeral 13 (FIG. 3) designates compensation parts (described later).

Figure 4:
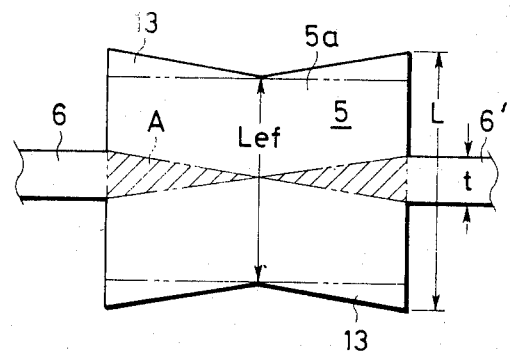
FIG. 4 is a plan view of a vibration plate shown in FIG. 2.

FIG. 4 is a plan view of the vibrating plate 5. In FIG. 4, the region A (indicated by the oblique lines), which is located between the pair of coupling pieces 6 and is not vibrated even when it is electrically energized, because the forces of support of the two coupling pieces 6 and 6' are applied to the region A. In order to compensate for the dead region A where no vibration takes place, according to the present invention the compensation parts 13 extend outwardly from peripheral parts (i.e., both ends) of the piezoelectric element 2 in the direction of vibration, of the vibrating plate 5. The configurations of the compensation parts 13 correspond to those which are obtained by dividing the dead region A into two symmetrical (equal) parts with respect to the centers of the short sides of the vibrating plate main part 5a. In other words, each compensation part 13 configured as is a pair of right-angled triangles which are symmetrical to each other with respect to the center of the long sides of the vibrating plate main part 5a.

Figure 5:
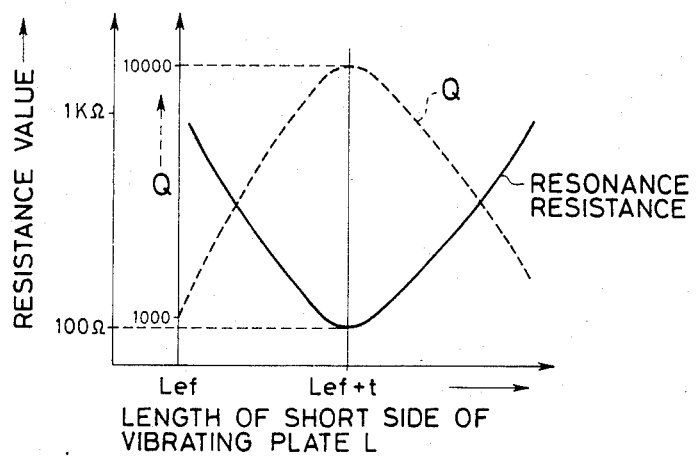
FIG. 5 is a characteristic diagram indicating relationships between effective lengths, resonance resistances and quality factors (Q) of piexoelectric elements.

The length L of the short side of the vibrating plate 5 is determined according to the following expression:

$$L = Lef + t,$$

where Lef is the effective length in the direction of the short side (or the length, in the direction of the short side, of the middle of the vibrating plate), and t is the width of each coupling piece 6 and 6'. In the vibrating plate 5 thus determined in dimension, the resonance resistance becomes minimum and the quality factor (Q) maximum as indicated in FIG. 5, a characteristic diagram.

Figure 6:
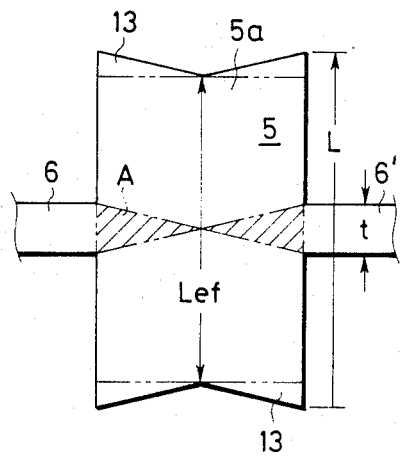
FIG. 6 is a plan view showing a vibration plate of another embodiment of the present invention.

In the above-described embodiment, the technical concept of the invention is applied to the piezoelectric resonator operating in the spreading vibration mode utilizing the short sides of the vibrating plate 5 whose main part 5a is rectangular. However, the technical concept of the invention is applicable to a piezoelectric resonator whose vibrating plate is square. Furthermore, even in the case of a vibrating plate having more than two coupling pieces 6 and 6', compensation parts can be provided for each dead region A. The present invention is also applicable to a piezoelectric resonator shown in FIG. 6. The piezoelectric resonator has a pair of coupling pieces 6 and 6' extending outwardly from the centers of the long sides of the vibrating plate 5 having a rectangular main part 5a, such resonator utilizing the spreading vibration mode of the long sides of the vibrating plate.

The foregoing describes a spreading vibration mode piezoelectric vibrator which has a piezoelectric element and is supported through at least one pair of coupling pieces by a holding frame. Compensation parts for compensating the dead region of the piezoelectric element formed between the coupling pieces extend outwardly from the peripheral parts of the piezoelectric element. Such spreading vibration mode piezoelectric vibrator may be miniaturized for high resonance frequency applications. Moreover, the resonance resistance of the piezoelectric element is appropriately decreased, and the quality factor (Q) is appropriately increased. In addition, the fluctuations in the resonance frequency characteristic of the piezoelectric vibrator and other characteristics of the vibrator are decreased.

Although a preferred embodiment of this invention has been described, many variations and modifications will now be apparent to those skilled in the art, and it is therefore preferred that the instant invention be limited not by the specific disclosure herein, but only by the appending claims.

What is claimed is:

1. A piezoelectric vibrator adapted to operate in a spreading vibration mode, comprising:
   a piezoelectric element;
   first and second coupling pieces coupled to respective opposite sides of said piezoelectric element;
   a holding frame supporting said piezoelectric element through said coupling pieces; and
   compensation means for compensating for a non-vibratory region of said piezoelectric element which is formed between said coupling pieces, said compensation means comprising peripheral parts of said piezoelectric element.

2. A piezoelectric vibrator as claimed in claim 1, wherein said piezoelectric element comprises a plate adapted to vibrate, a main part of said plate being rectangular.

3. A piezoelectric vibrator as claimed in claim 2, wherein said compensation means have the same configuration as those which are obtained by dividing said non-vibratory region into two symmetrical parts with respect to a center line of said vibrator, which center line passes through the respective centers of said coupling pieces as measured along respective sides of said piezoelectric element to which the coupling pieces are attached.

4. A piezoelectric vibrator as claimed in claim 3, wherein said respective sides lie generally parallel to each other and said plate has a non-uniform width as measured in a direction parallel to said respective sides, and at least one of said respective sides of said plate has the length L determined by the following expression:

$$L = Lef + t,$$

where Lef is the shortest width dimension of said plate, and t is the width of said coupling pieces adjoined to said respective sides.

5. A piezoelectric vibrator as claimed in claim 1, wherein said peripheral parts extend in a non-uniform manner from a center line of said vibrator, which center line passes through the respective centers of said coupling pieces as measured along the respective sides of said piezoelectric element to which the coupling pieces are attached.

* * * * *